US007535790B2

(12) United States Patent
Harada

(10) Patent No.: US 7,535,790 B2
(45) Date of Patent: May 19, 2009

(54) SEMICONDUCTOR DEVICE USING DYNAMIC CIRCUIT

(75) Inventor: Akihiko Harada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 162 days.

(21) Appl. No.: 11/806,453

(22) Filed: May 31, 2007

(65) Prior Publication Data
US 2007/0242556 A1 Oct. 18, 2007

Related U.S. Application Data

(63) Continuation of application No. PCT/JP2004/017854, filed on Dec. 1, 2004.

(51) Int. Cl.
G11C 8/00 (2006.01)
(52) U.S. Cl. .............................. 365/233.12; 365/233.1; 365/233.11
(58) Field of Classification Search .............. 365/233.1, 365/233.11, 233.12, 233.14
See application file for complete search history.

(56) References Cited
U.S. PATENT DOCUMENTS

| 5,946,251 | A | 8/1999 | Sato et al. | |
| 6,160,746 | A | 12/2000 | Park et al. | |
| 6,204,707 | B1 | 3/2001 | Hamada et al. | |
| 6,654,305 | B2 * | 11/2003 | Tsunoda et al. | ............. 365/226 |
| 2003/0062949 | A1 | 4/2003 | Suzuki | |
| 2003/0235107 | A1 * | 12/2003 | Jang | ............ 365/233 |
| 2004/0004899 | A1 | 1/2004 | Choi | |

FOREIGN PATENT DOCUMENTS

| JP | 05-167432 | 7/1993 |
| JP | 2000-232339 | 8/2000 |
| JP | 2003-109382 | 4/2003 |
| JP | 2003-271267 | 9/2003 |

OTHER PUBLICATIONS

Supplementary European Search Report, mailed Dec. 21, 2007 and issued in corresponding European Patent Application No. 04822508.0-2215.
International Search Report of International Published Application No. PCT/JP2004/017854 (mailed Jan. 25, 2005).
PCT Published Application No. WO 2006/059379, Published Jun. 8, 2006 (International Application No. PCT/JP2004/017854).

(Continued)

Primary Examiner—Tuan T. Nguyen
Assistant Examiner—Hien Nguyen
(74) Attorney, Agent, or Firm—Staas & Halsey LLP

(57) ABSTRACT

The present invention provides a semiconductor device having a plurality of functional blocks and a select signal generation circuit for supplying a select signal to a functional block to be operated out of the plurality of blocks. A clock generation unit in the function clock, to which the select signal and a system clock are supplied, generates a control clock based on the system clock when the select signal is being supplied, and stops generation of the control clock when the select signal is not being supplied. When the select signal is not received, a dynamic circuit provided inside the functional block does not operate since the control clock is not supplied. When the select signal is received, the control clock is supplied and the dynamic circuit repeats precharge and discharge for each clock cycle, and performs operation to execute a predetermined function, and consumes power.

6 Claims, 14 Drawing Sheets

OTHER PUBLICATIONS

Hai Li et al., "DCG: Deterministic Clock-Gating for Low-Power Microprocessor Design", IEEE Transactions on Very Large Scale Integration (VLSI) Systems, vol. 12, No. 3, Mar. 2004, pp. 245-254.

Korean Office Action, mailed May 30, 2008, and issued in corresponding Korean Patent Application No. 10-2007-7013352.

* cited by examiner

FIG. 15

|  | A STATIC CIRCUIT | B DYNAMIC CIRCUIT (POWER SAVING MODE SIGNAL NOT SUPPLIED) | C DYNAMIC CIRCUIT (POWER SAVING MODE SIGNAL SUPPLIED) |
|---|---|---|---|
| CYCLE TIME | 1 | 0.74 | 0.74 |
| ACCESS TIME | 1 | 0.80 | 0.80 |
| POWER CONSUMPTION | 1 | 1.37 | 0.64 |

SEMICONDUCTOR DEVICE USING DYNAMIC CIRCUIT

CROSS-REFERENCE TO RELATED APPLICATIONS

This application is a continuation of international application PCT/JP2004/017854, filed on Dec. 1, 2004.

TECHNICAL FIELD

The present invention relates to a semiconductor device using dynamic circuits, and more particularly to a semiconductor device for saving power of dynamic circuits.

BACKGROUND ART

Recently as the degree of integration of semiconductor devices increases, the power consumption of semiconductor devices is also increasing. Therefore power saving of semiconductor devices is demanded, and an example of circuits, for which power consumption is suppressed, is a circuit disclosed in Japanese Patent Application Laid-Open No. 2000-232339. However the technology disclosed in Japanese Patent Application Laid-Open No. 2000-232339 concerns the power saving of a flip-flop circuit, and cannot be applied to dynamic circuits in general.

Out of CMOS circuits of which power can be saved, a static circuit is constructed by a combination of n-type MOS transistors and p-type MOS transistors according to the number of inputs. However the operation speed of a p-type MOS transistor is slower than that of an n-type MOS transistor, and it is desirable that the p-type MOS transistors are not connected in series as much as possible in order to increase the speed of the circuit.

FIG. 1 is a diagram depicting an 8-input OR circuit implemented by static circuits. The 8-input terminals a0-a7 of the OR circuit in FIG. 1 are connected to the gates of the 8 p-type MOS transistors 410-417 and the 8 n-type MOS transistors 420-427 respectively. An inverter 430 is connected to a node 440 of the p-type MOS transistors 410-417 connected in series and the n-type MOS transistors 420-427 connected in parallel, and the output of [the inverter 430] becomes the output terminal of this OR circuit.

In this OR circuit, if all 8-inputs a0-a7 become low level (hereafter L level), all the p-type MOS transistors 410-417 turn ON, and the node 440 becomes high level (hereafter H level). And the L level, inverted by the inverter 430, is output to the output z. In this case, the delay time is long since all 8 p-type MOS transistors 417-410 must turn ON. In this way, if an OR circuit having a large number of inputs, as above, is constructed by a static circuit, the operation speed drops since the p-type MOS transistors are connected in series, and this causes a drop in the operation speed of the entire device. In order to decrease the number of p-type MOS transistors connected in series, the number of logical stages must be increased, so the delay time per stage is improved, but the total delay time improves little.

Because of this, a dynamic circuit was proposed in order to improve the delay in operation due to the p-type MOS transistors. Now for simplification a dynamic circuit will be described using the case of an 8-input OR circuit as an example.

FIG. 2 is a block diagram depicting an 8-input OR circuit implemented by a dynamic circuit. Between a p-type MOS transistor 520, to which clock CK is input, and an n-type MOS transistor 550, 8 n-type MOS transistors 510-517 are connected in parallel. The input terminals b0-b7 of the 8-input OR circuit are connected respectively to the gates of the n-type MOS transistors 510-517. An inverter 540 is connected to a node 560 between the p-type MOS transistor 520 and the 8 n-type type transistors 510-517 connected in parallel, and the output thereof becomes the output of the 8-input OR circuit. A p-type MOS transistor 530 is provided for latching the H level of the node 560, and the output of the inverter 540 is also input to this gate.

In this circuit, if the clock CK becomes L level, the p-type MOS transistor 520 is turned ON, the n-type MOS transistor 550 is turned OFF, the node 560 is precharged, and the output z in this case becomes L level, regardless the values of the input a0-a7 (precharge mode). And when the clock CK becomes H level, the n-type MOS transistor 550 is turned ON, and the computing result is output (evaluation mode). If all of the 8-inputs b0-b7 are L level, the output z is L level since the node 560 remains precharged by the p-type MOS transistor 530. In this case, the output z, which was reset to L level when the clock CL is in L level, remains L level even after the clock CK is switched to H level. In other words, the delay time in this case is 0. If one of the 8-inputs b0-b7 is H level, on the other hand, the output z becomes H level since the node 560 is discharged when the H level is input to the clock CK. The delay time in this case [is generated] only for one inverter on the path from the ground to the output terminal and 2 n-type MOS transistors.

In this way, if a dynamic circuit is used, the delay time can be decreased compared with the case of using a static circuit.

DISCLOSURE OF THE INVENTION

In a static circuit, however, a charge or discharge is performed only when the output z changes according to the change of input, and power is not consumed when the input does not change and the output z therefore does not change. Whereas in the case of a dynamic circuit, if one of the inputs b0-b7 is in H level, a precharge and discharge are performed at every cycle of the clock CK. Therefore power is consumed even if the inputs b0-b7 are unchanged. In other words, if a dynamic circuit is used, the delay time can be decreased compared with the case of using a static circuit, but power consumption increases more than the case of using a static circuit.

With the foregoing in view, it is an object of the present invention to provide a semiconductor device which uses a dynamic circuit with which high-speed operation is possible, and which can decrease power consumption.

To solve the above problem, a first aspect of the present invention provides a semiconductor device having a plurality of functional blocks and a select signal generation circuit for supplying a select signal to a function block to be operated out of the plurality of functional blocks, characterized in that [each of] the plurality of functional blocks further has: a clock generation unit to which the select signal and a system clock are supplied, and which generates a control clock based on the system clock when the select signal is being supplied, and stops generation of the control clock when the select signal is not being supplied; and dynamic circuits where a p-type transistor of which gate is supplied with the control clock and an n-type transistor of which gate is supplied with an input signal are provided in series between a power supply and a ground, and a node between the p-type transistor and the n-type transistor is precharged responding to the supply of the control clock, and is discharged responding to the input signal.

In the first aspect of the present invention, it is preferable that the clock generation unit further has: a clock control section to which the select signal and a system clock are supplied and which starts generation of a control clock enable signal responding to the supply of the select signal, and ends generation of the control clock enable signal responding to the end of 1 cycle of the system clock; and a clock generation section to which the control clock enable signal and the system clock are supplied, and which generates the control clock based on the system clock while the control clock enable signal is being supplied, and stops generation of the control clock while the control clock enable signal is not being supplied.

It is preferable that the first aspect of the present invention further has the clock control section which starts generation of the control clock enable signal responding to the supply of the select signal, and ends generation of the control clock enable signal responding to the end of 1 cycle of the system clock when a power saving mode signal is being supplied, and generates the control clock enable signal regardless the input of the select signal when the power saving mode signal is not being supplied.

The second aspect of the present invention provides a semiconductor memory having a plurality of memory blocks and an address predecoder for supplying a block select signal to a memory block for performing reading or writing out of the plurality of memory blocks, characterized in that [each of] the plurality of memory blocks further has: a clock generation unit to which the block select signal and a system clock are supplied, and which generates a control clock based on the system clock when the block select signal is being supplied, and stops the generation of the control clock when the block select signal is not being supplied; a memory cell group for holding data; a row decoder for selecting a word line of data of a memory cell; a row driver for driving the word line selected by the row decoder; a column decoder for selecting a column of the memory cell; a column driver for supplying a column select signal CSL to the column selected by the column decoder; and an output circuit group to which the bit line of the memory cell group is input and from which a read data is output, characterized in that the row decoder, the row driver, the column decoder, the column driver and the output circuit group are constructed by dynamic circuits where a p-type transistor of which gate is supplied with the control clock and an n-type transistor of which gate is supplied with an input signal are provided in series between a power supply and a ground, a node between the p-type transistor and the n-type transistor is precharged responding to supply of the control clock and discharged responding to the input signal.

In the second aspect of the present invention, it is preferable that the clock generation unit further has: a clock control section to which the block select signal and a system clock are supplied, and which starts generation of a control clock enable signal responding to the supply of the block select signal, and ends generation of the control clock enable signal responding to the end of 1 cycle of the system clock; and a clock generation section to which the control clock enable signal and the system clock are supplied, and which generates the control clock based on the system clock while the control clock enable signal is being supplied, and stops generation of the control clock while the control clock enable signal is not being supplied.

In the second aspect of the present invention, it is preferable that the clock generation unit further has: a clock control section which starts generation of the control clock enable signal responding to the supply of the block select signal, and ends generation of the control clock enable signal responding to the end of 1 cycle of the system clock when a power saving mode signal is being supplied, and generates the control clock enable signal regardless the input of the block select signal when the power saving mode signal is not being supplied.

According to the semiconductor device of the present invention, dynamic circuits which are operated at a certain clock cycle are selected, and dynamic circuits which perform precharge and discharge are limited, so that power consumption of a semiconductor device using dynamic circuits can be suppressed.

BRIEF DESCRIPTION OF THE DRAWINGS

FIG. 15 is a table showing the degree of improvement of a cycle time, access time and power consumption of the RAM system of the present embodiment.

BEST MODE FOR CARRYING OUT THE INVENTION

Embodiments of the present invention will now be described with reference to the drawings. The technical scope of the present invention, however, is not limited to these embodiments, but covers matters stated in the Claims and equivalents thereof.

Figure 3:
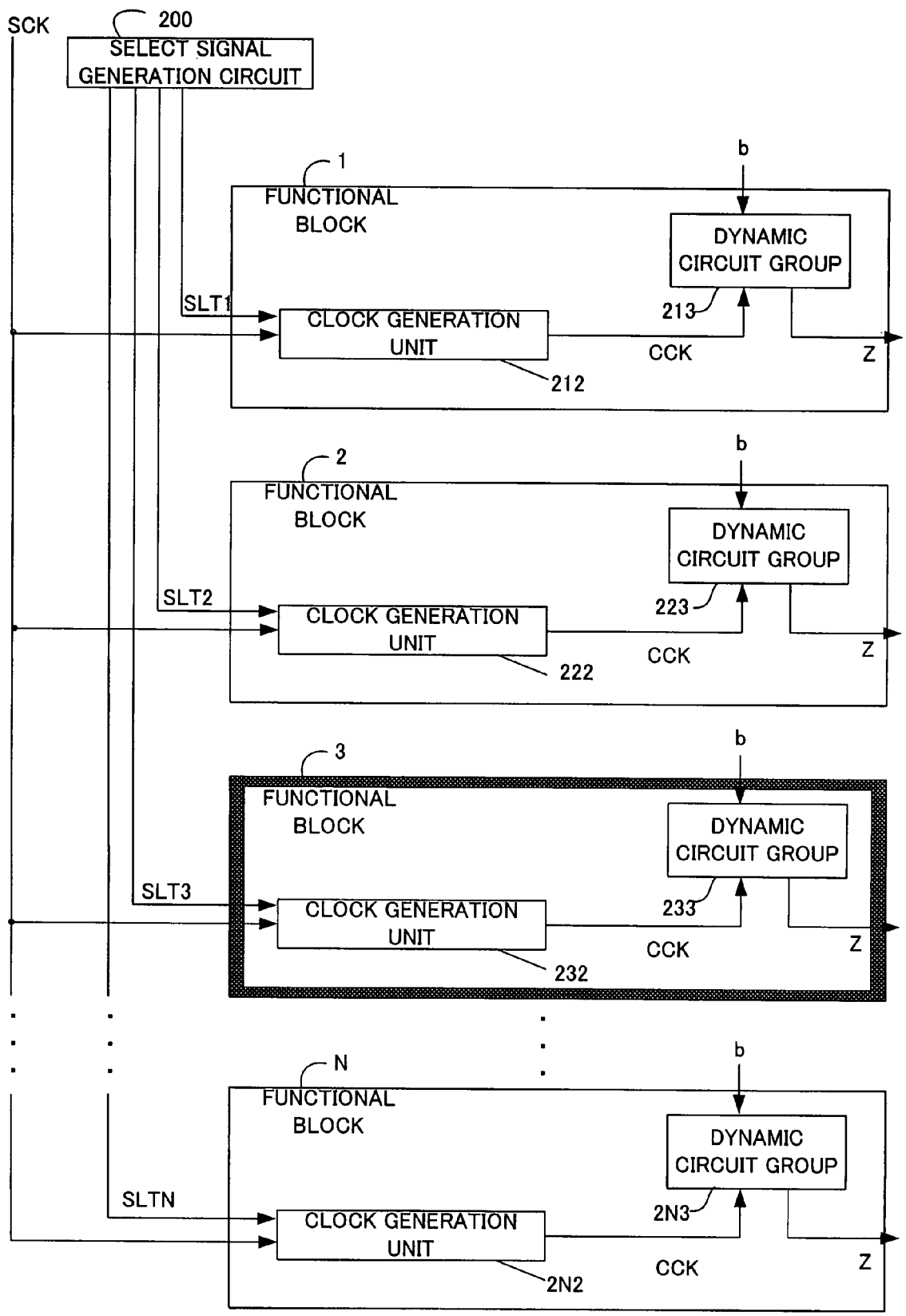
FIG. 3 is a block diagram depicting a semiconductor device according to the first embodiment of the present invention.

FIG. 3 is a block diagram depicting the semiconductor device according to the first embodiment of the present invention. In the first embodiment, a plurality of functional blocks 1 to N and a select signal generation circuit 200 outside [the functional blocks] are provided in a semiconductor device using dynamic circuits. And a system clock SCK is supplied to each functional block.

The select signal generation circuit 200 selects a functional block by supplying a select signal SLT to one of the clock generation units 212-2N2 in the functional block to be selected. In the following description, it is assumed that the functional block 3 is selected. When the functional block 3 is selected, the select signal generation circuit 200 supplies the select signal SLT to a clock generation unit 232 in the functional block 3. When the select signal SLT is supplied, the clock generation unit 232 generates a control clock CCK based on the supplied system clock SCK. The control clock CCK includes a clock which is generated by delaying the supplied system clock SCK, and a clock having an L level with a short pulse width at the rise edge timing of the system clock SCK. The generated control clock CCK is supplied to the dynamic circuit group 233 in the functional block 3. If the select signal SLT is not supplied, the clock generation unit 232 does not generate the control clock CCK.

Figure 1:
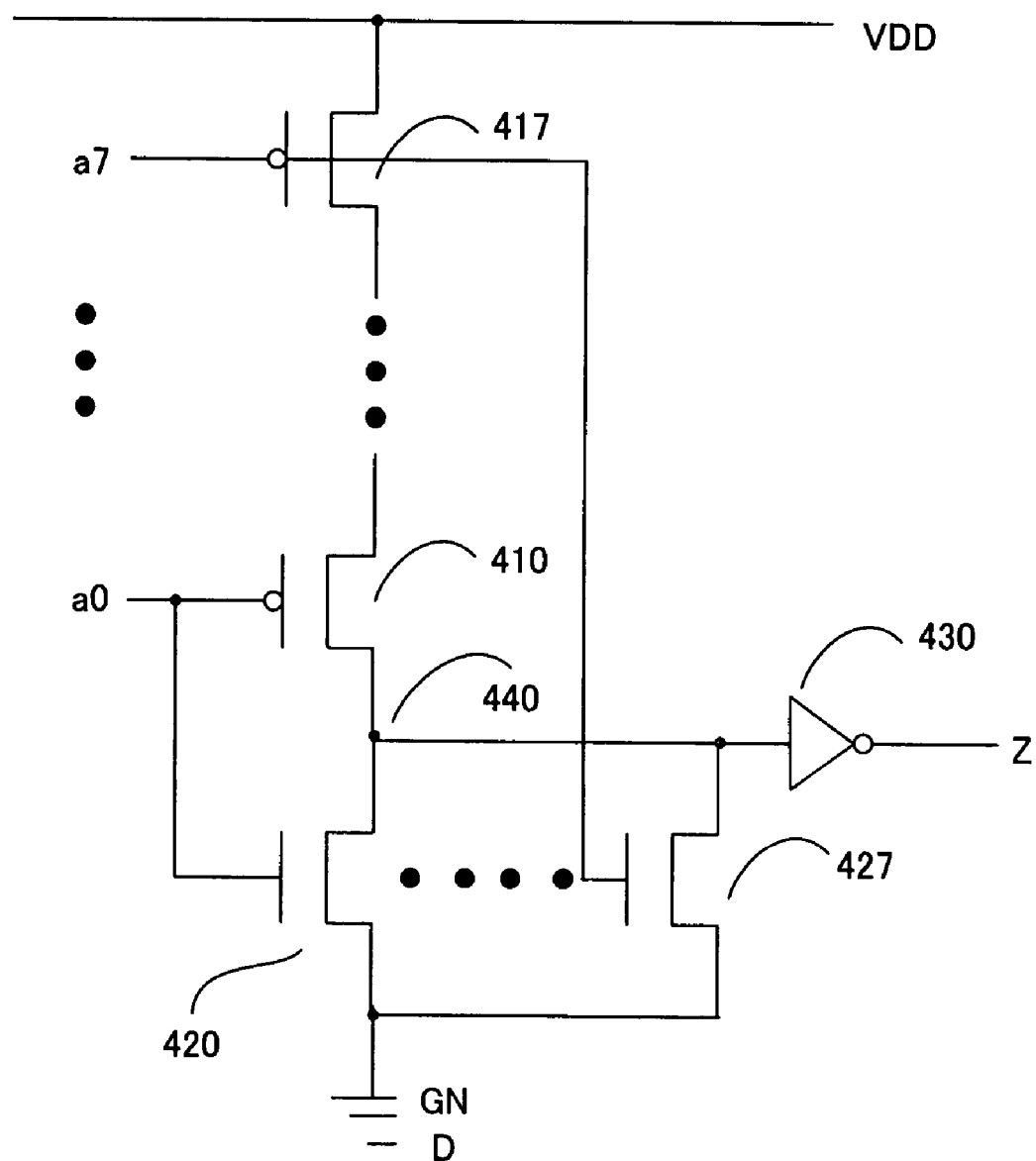
FIG. 1 is a circuit diagram of an 8-input OR circuit implemented with a static circuit.
Figure 2:
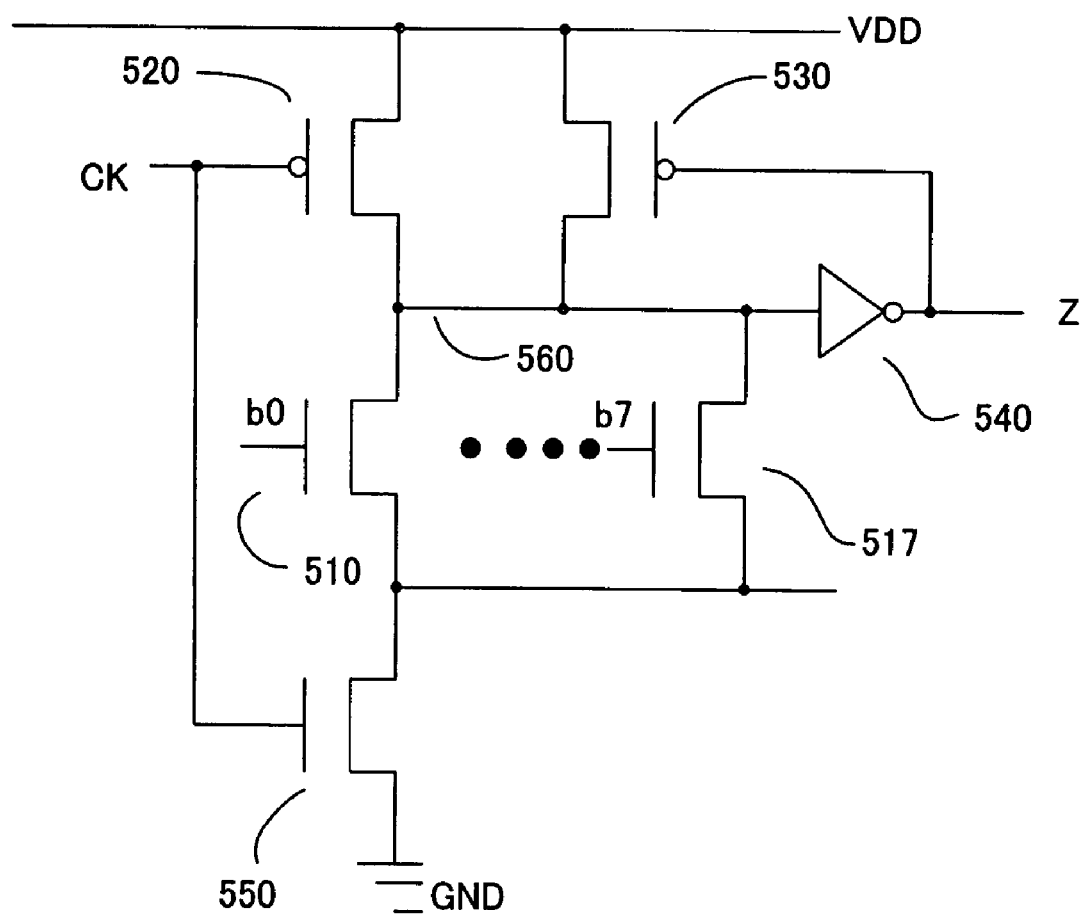
FIG. 2 is a circuit diagram of an 8-input OR circuit implemented with a dynamic circuit.

The dynamic circuit is a circuit shown in FIG. 2, where a p-type MOS transistor of which gate is supplied with the control clock CCK and an n-type MOS transistor of which gate is supplied with an input signal b are provided in series, and a node between the p-type MOS transistor and the n-type MOS transistor is precharged responding to the supply of the control clock CCK, and is discharged responding to the input signal b. This circuit is not limited to the OR circuit, but may be a simple inverter or an AND circuit. The dynamic circuit group 233 in the selected functional block 3 performs operation to execute a predetermined function when the control clock CCK is supplied. In this case, precharge and discharge are repeated responding to the control clock CCK and power is consumed. But the dynamic circuit group in an unselected functional block, to which control clock CCK is not supplied, does not perform an operation to execute a predetermined function, and power is not consumed.

In this way, the semiconductor device according to the present embodiment can suppress power consumption by selecting dynamic circuits to be operated, limiting dynamic circuits which perform precharge and discharge. Therefore a semiconductor device which uses dynamic circuits for high-speed operation and which can still decrease power consumption can be implemented.

Figure 4:
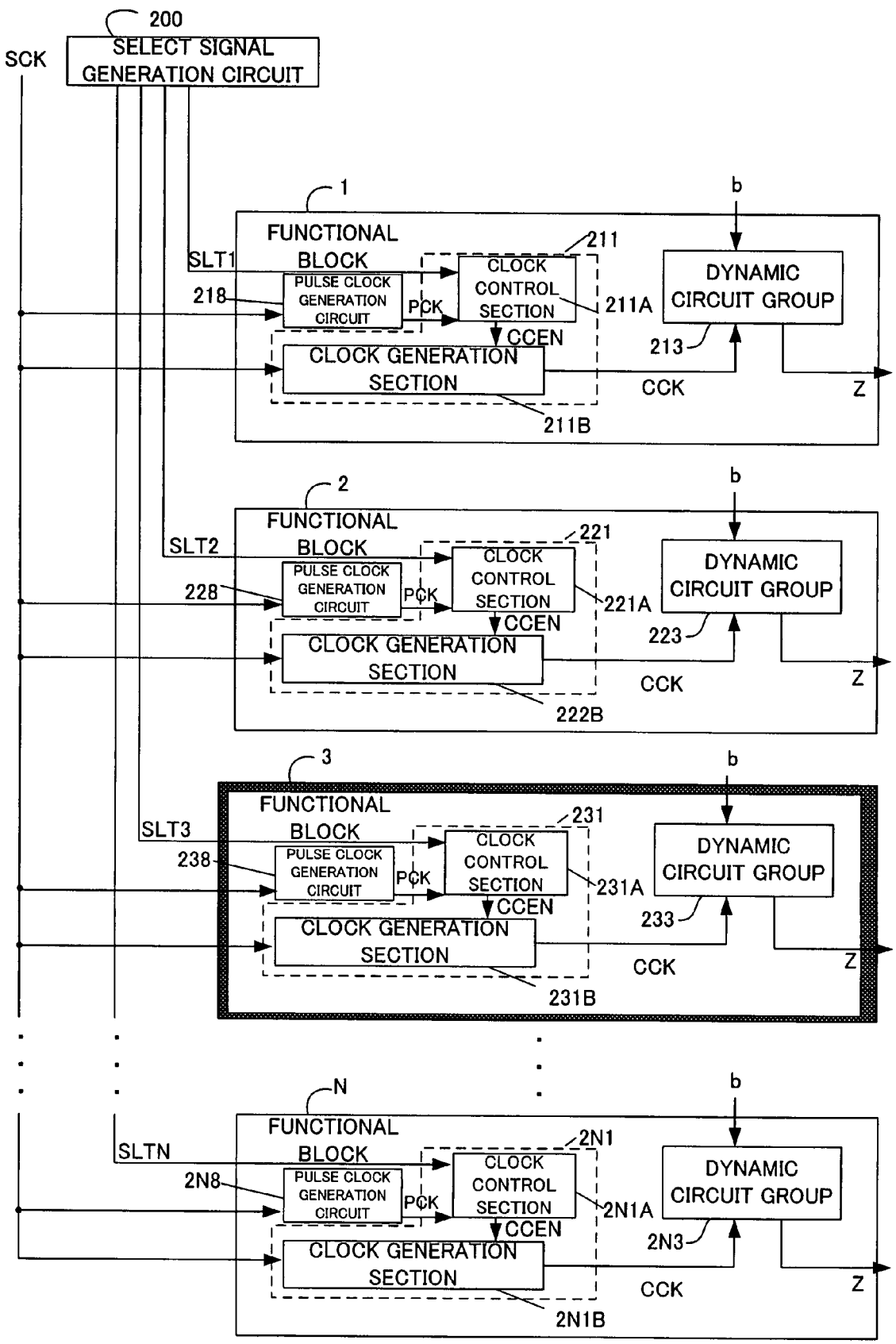
FIG. 4 is a block diagram depicting a semiconductor device according to the second embodiment of the present invention.

FIG. 4 is a block diagram depicting a semiconductor device according to the second embodiment of the present invention. In the second embodiment, clock control sections 211A-2N1A and clock generation sections 211B-2N1B are provided in clock generation units 211-2N1. The clock control sections 211A-2N1A generate a control clock enable signal CCEN. The clock generation sections 211B-2N1B generate a control clock CCK. In functional blocks 1-N, pulse clock generation circuits 218-2N8 are provided so as to generate a pulse clock PCK synchronizing with a system clock SCK.

Figure 5:
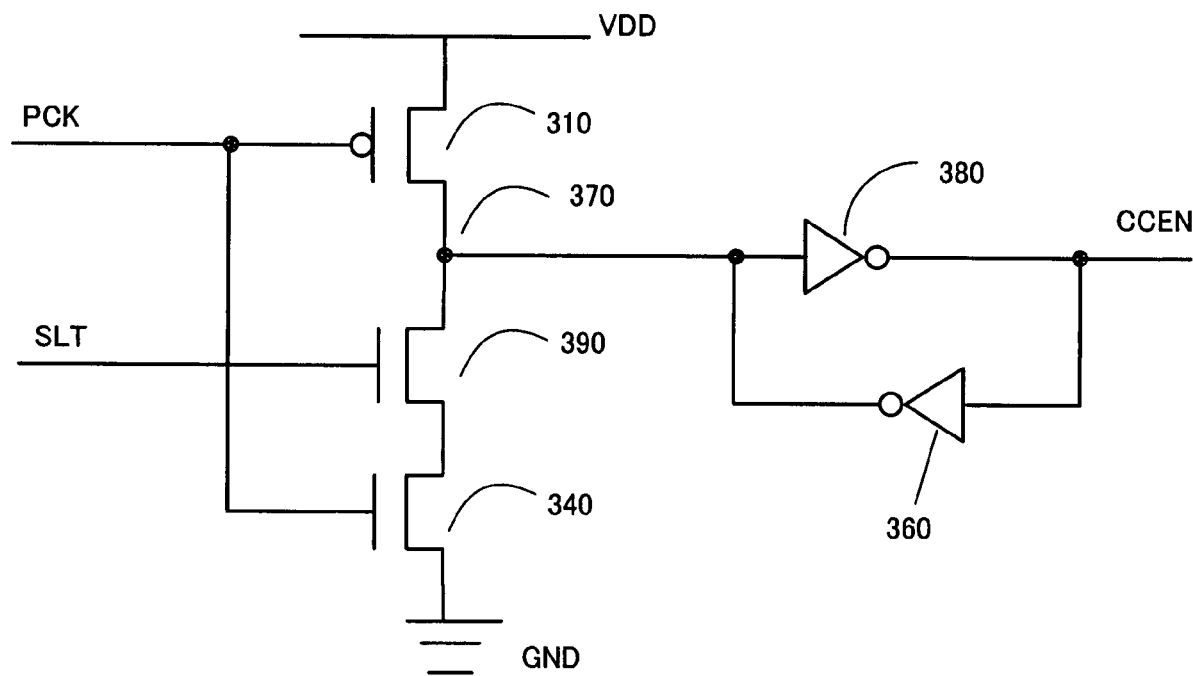
FIG. 5 is a circuit diagram depicting a clock control section provided in a clock generation unit.

FIG. 5 is a circuit diagram depicting the clock control sections 211A-2N1A provided in the clock generation units 211-2N1 in the present embodiment. A p-type MOS transistor 310 and an n-type MOS transistors 390 and 340 are connected in series, and a pulse clock PCK is supplied to the gates of the P type MOS transistor 310 and the n-type MOS transistor 340. A select signal SLT is supplied to the gate of the n-type MOS transistor 390. An inverter 380 is connected to a node 370 between the p-type MOS transistor 310 and the n-type MOS transistor 390, and the output thereof becomes a control clock enable signal CCEN. An inverter 360, for latching the control clock enable signal CCEN, is also connected to the node 370, the input of the inverter 360 is connected to the output of the inverter 380, and the output of the inverter 360 is connected to the input of the inverter 380.

Figure 6:
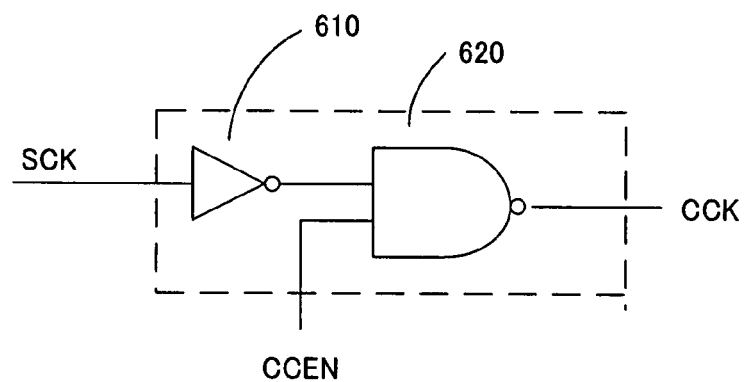
FIG. 6 is a circuit diagram depicting a clock generation section provided in a clock generation unit.

FIG. 6 is a circuit diagram depicting the clock generation sections 211B-2N1B provided in the clock generation units 211-2N1 according to the present embodiment. The system clock SCK inverted by an inverter 610, along with the control clock enable signal CCEN, are input to a NAND gate 620. The NAND gate 620 outputs the control clock CCK which is supplied to the dynamic circuit group.

Figure 7:
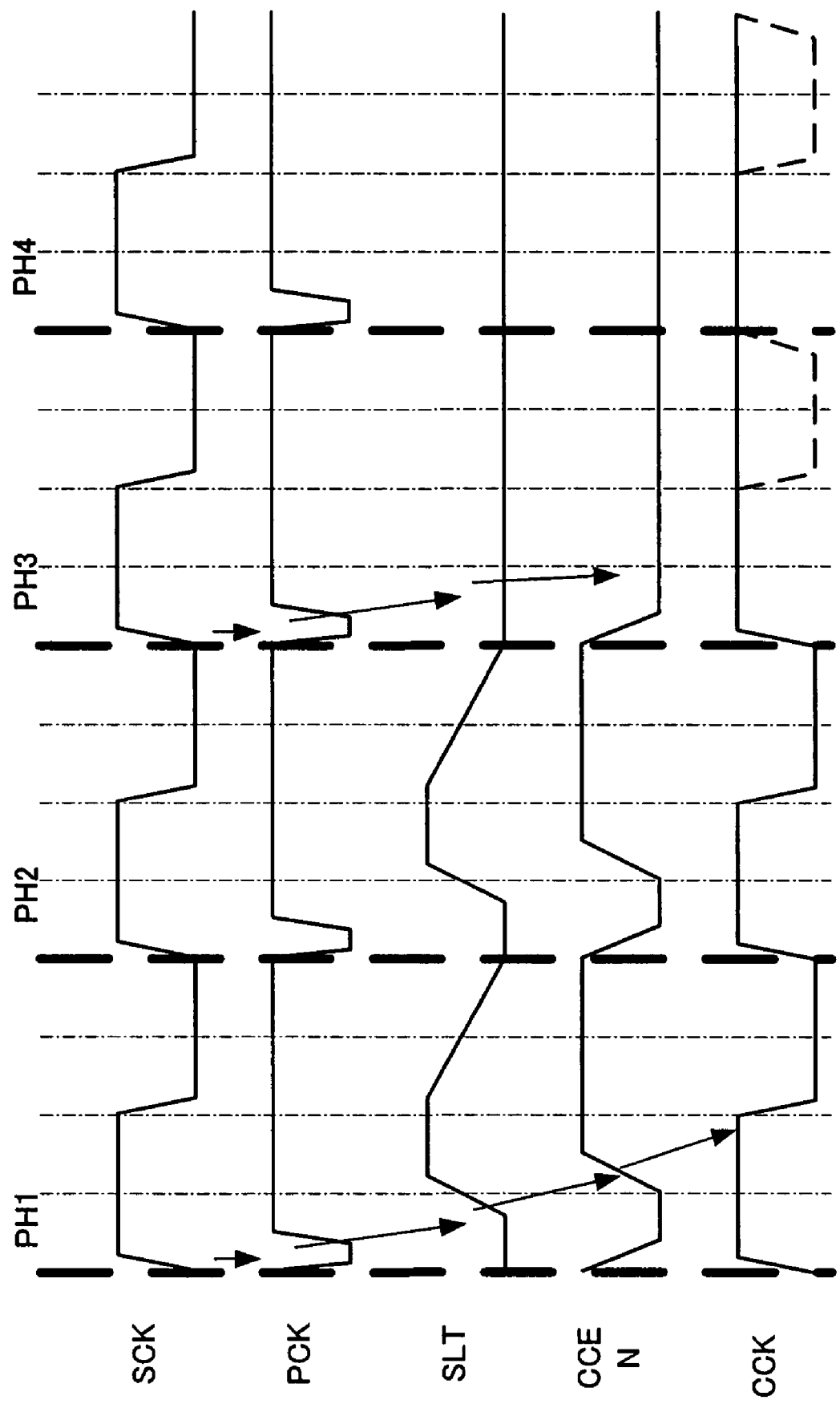
FIG. 7 is a timing chart of the second embodiment of the present invention.

FIG. 7 is a timing chart according to the present embodiment. The phase PH1 and phase PH2 show the timing chart when the functional block is selected, and phase PH3 and phase PH4 show the timing chart when the functional block is not selected.

The operation when the select signal SLT is supplied will now be described with reference to phase PH1 and phase PH2 in FIG. 7. Hereafter it is again assumed that the functional block 3 is selected. Synchronizing with the rise edge of the system clock SCK, the pulse clock generation circuit 238 generates a pulse clock PCK having L level with a short pulse width. The L level with a short pulse width is input to the gate of the p-type MOS transistor 310 of the clock control section 231A (see FIG. 5). By this, the p-type MOS transistor 310 turns ON, the node 370 is precharged, and the control clock enable signal CCEN is reset to L level. Then this is switched to H level of the pulse clock PCK, and the n-type MOS transistors 390 and 340 are turned ON by the supply of the select signal SLT in H level. The p-type MOS transistor 310 is turned OFF, and by this the node 370 is discharged and the control clock enable signal CCEN becomes H level. Then by the input of the L level of the pulse clock PCK in phase PH2, the control clock enable signal CCEN is reset to L level.

The control clock enable signal CCEN, along with the inverted system clock SCK, are input to the NAND gate 620 of the clock generation section 231B (see FIG. 6). Therefore if the control clock enable signal CCEN is in H level, the system clock SCK, delayed by the inverter 610 and the NAND gate 620, is output as the control clock CCK.

In this way, if the select signal SLT is supplied, the control clock CCK repeats H level and L level, and is used for controlling a dynamic circuit.

Operation when the select signal SLT is not supplied will now be described with reference to phase PH3 and phase PH4 in FIG. 7. In the description, it is assumed that the functional block 1 is a functional block which was not selected. The control clock CCEN is reset to L level by the L level of the pulse clock PCK with a short pulse width. Then the pulse clock PCK is switched to H level, but the select signal SLT is not supplied in phase PH3. Therefore the n-type MOS transistor 390 does not turn ON, and the node 370 is not discharged. So the control clock enable signal CCEN does not become H level and is maintained in L level.

The control clock enable signal CCEN, along with the inverted system clock SCK, are input to the NAND gate 620 of the clock generation section 211B (see FIG. 6). Therefore if the control clock enable signal CCEN is in L level, the control clock CCK is maintained in H level regardless the status of the system clock SCK.

In this way, if the select signal SLT is not supplied, the control clock CCK is maintained in H level, and enters stop status.

The dynamic circuit group 233 in the selected functional clock 3 performs operation to execute a predetermined function when the control clock CCK is supplied. In this case, precharge and discharge are repeated and power is consumed. However the dynamic circuit group 213 in the functional block 1, which is not selected and to which the control clock CCK is not supplied, does not perform an operation to execute a predetermined function and power is not consumed.

In this way, the semiconductor device according to the present embodiment can suppress power consumption by selecting dynamic circuits to be operated and limiting dynamic circuits which perform precharge and discharge. Therefore a semiconductor device which uses dynamic circuits for high-speed operation and which can still decrease power consumption can be implemented.

Also in the present embodiment, using the clock control section, the control clock enable signal CCEN is reset to L level in the beginning of each cycle, synchronizing with the system clock SCK, and when the select signal SLT becomes H level in each cycle, the control clock enable signal CCEN is set to H level, and the H level is maintained during this cycle regardless the select signal, so that the clock generation section 231B is activated, and the control clock CCK can be generated.

The control clock enable signal CCEN is generated during a 1 clock cycle. A similar semiconductor device can be implemented by using the select signal SLT which is supplied during only a predetermined period in 1 clock cycle by generating the control clock CCK while the control clock enable signal CCEN is being supplied.

Figure 8:
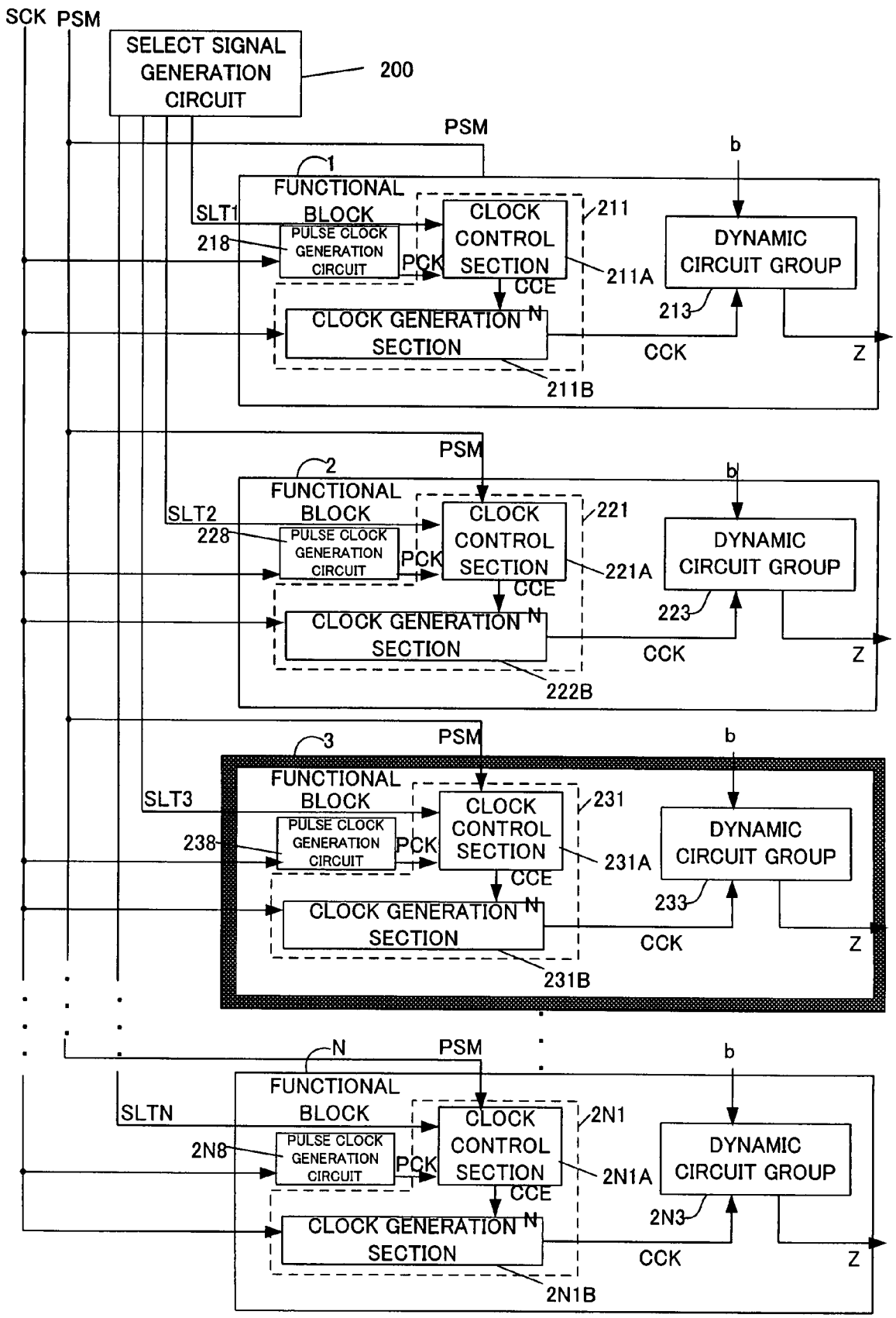
FIG. 8 is a block diagram depicting a semiconductor device according to the third embodiment of the present invention.

FIG. 8 is a block diagram depicting a semiconductor device according to the third embodiment of the present invention. In the present embodiment, a power saving mode signal PSM is supplied to clock control sections 211A-2N1A in clock generation units 211-2N1. If this signal is supplied, the clock control sections 211A-2N1A function in the same way as the clock sections in the second embodiment, and only when a select signal SLT is supplied, dynamic circuit groups 213-2N3 in the functional blocks 1-N operate, and power is consumed. If the power saving mode signal PSM is not supplied, the clock control sections 211A-2N1A output a control clock enable signal CCEN whether the select signal SLT is supplied or not from a select signal generation circuit 200.

By using this signal PSM, the clock control sections 211A-2N1A can be stopped while the semiconductor device is operating when the power saving function must be stopped.

Figure 9:
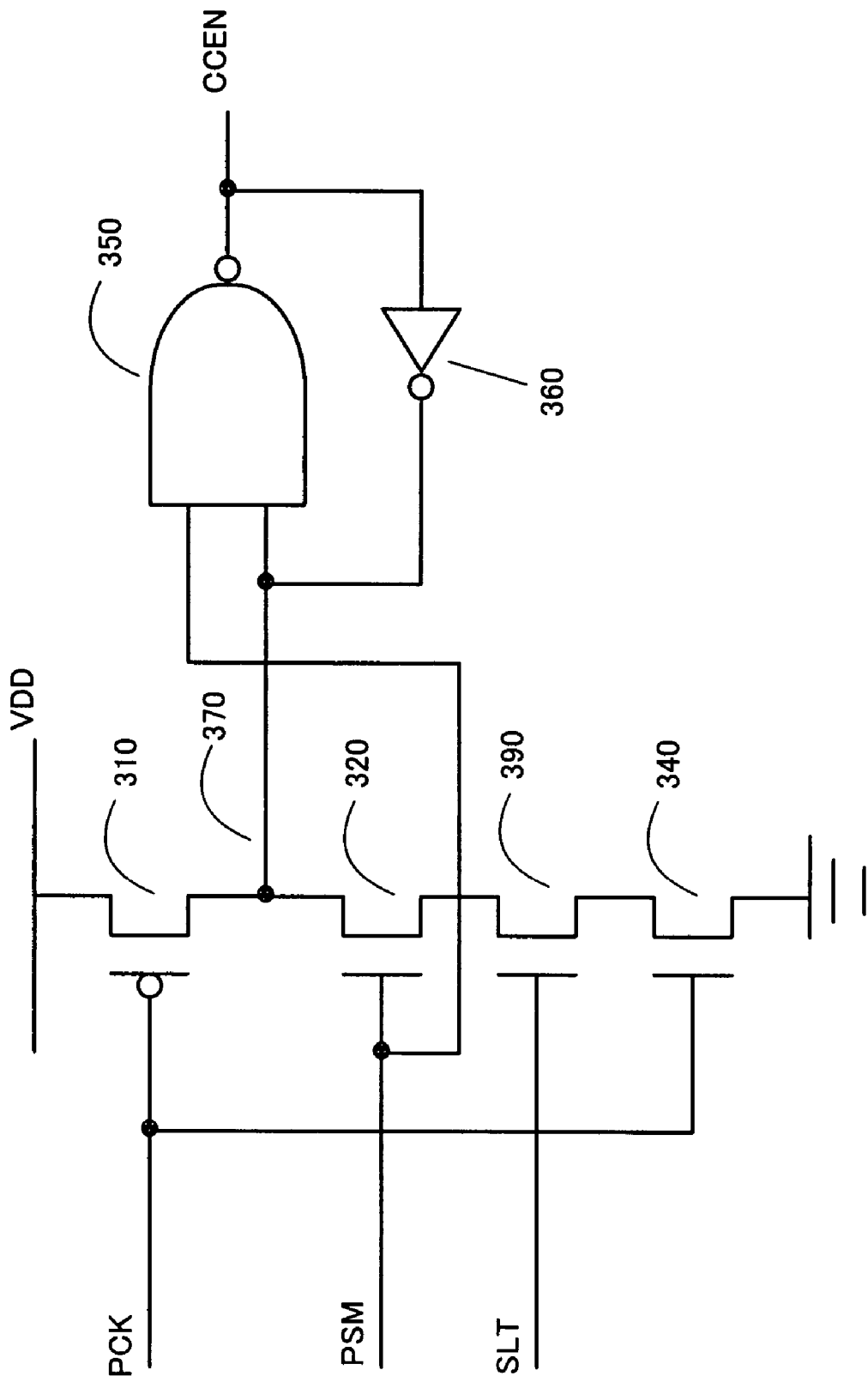
FIG. 9 is a circuit diagram depicting a clock control section according to the third embodiment of the present invention.

FIG. 9 is a circuit diagram depicting the clock control section in the present embodiment. A p-type MOS transistor 310 and n-type MOS transistors 320, 390 and 340 are connected in series, and a pulse clock PCK is supplied to the gates of the p-type MOS transistor 310 and the n-type MOS transistor 340. The select signal SLT is supplied to the gate of the n-type MOS transistor 390, and the power saving mode signal PSM is supplied to the gate of the n-type MOS transistor 320. A NAND gate 350 is connected to a node 370 between the p-type MOS transistor 310 and the n-type MOS transistor 320, and the power saving mode signal PSM is supplied to the other input. The output of the NAND gate 350 becomes a control clock enable signal CCEN. An inverter 360, for latching the control clock enable signal CCEN, is also connected to [the node 370], and the input [of the inverter 360] is connected to the output of the NAND gate 350, and the output [of the inverter 360] is connected to the node 370.

When the power saving mode signal PSM is supplied, H level is supplied to one input of the NAND gate 350, and the NAND gate 350 becomes the same as the inverter. H level is also supplied to the gate of the n-type MOS transistor 320, the n-type MOS transistor 320 turns ON, and the clock control section in the present embodiment becomes the same as the clock control section in the second embodiment shown in FIG. 6.

If the power saving mode signal PSM is not supplied, the n-type MOS transistor 320 does not turn ON, so the node 370 cannot be discharged. One input of the NAND gate 350 becomes L level, and the control clock enable signal CCEN, which is an output, becomes H level.

In this way, according to the present embodiment, the semiconductor device operates in the same way as the second embodiment when the power saving mode signal PSM is supplied. If the power saving mode signal PSM is not supplied, the control clock enable signal CCEN is output, and the control clock CCK is generated whether the select signal SLT is supplied or not.

As described above, the clock control sections 211A-2N1A can be stopped while the semiconductor device is operating when the power saving function must be stopped. If the semiconductor device performed an unstable operation, the clock control section can be stopped while the semiconductor device is operating, so as to examine whether the problem is in the clock control section or in other sections of the semiconductor device.

Figure 10:
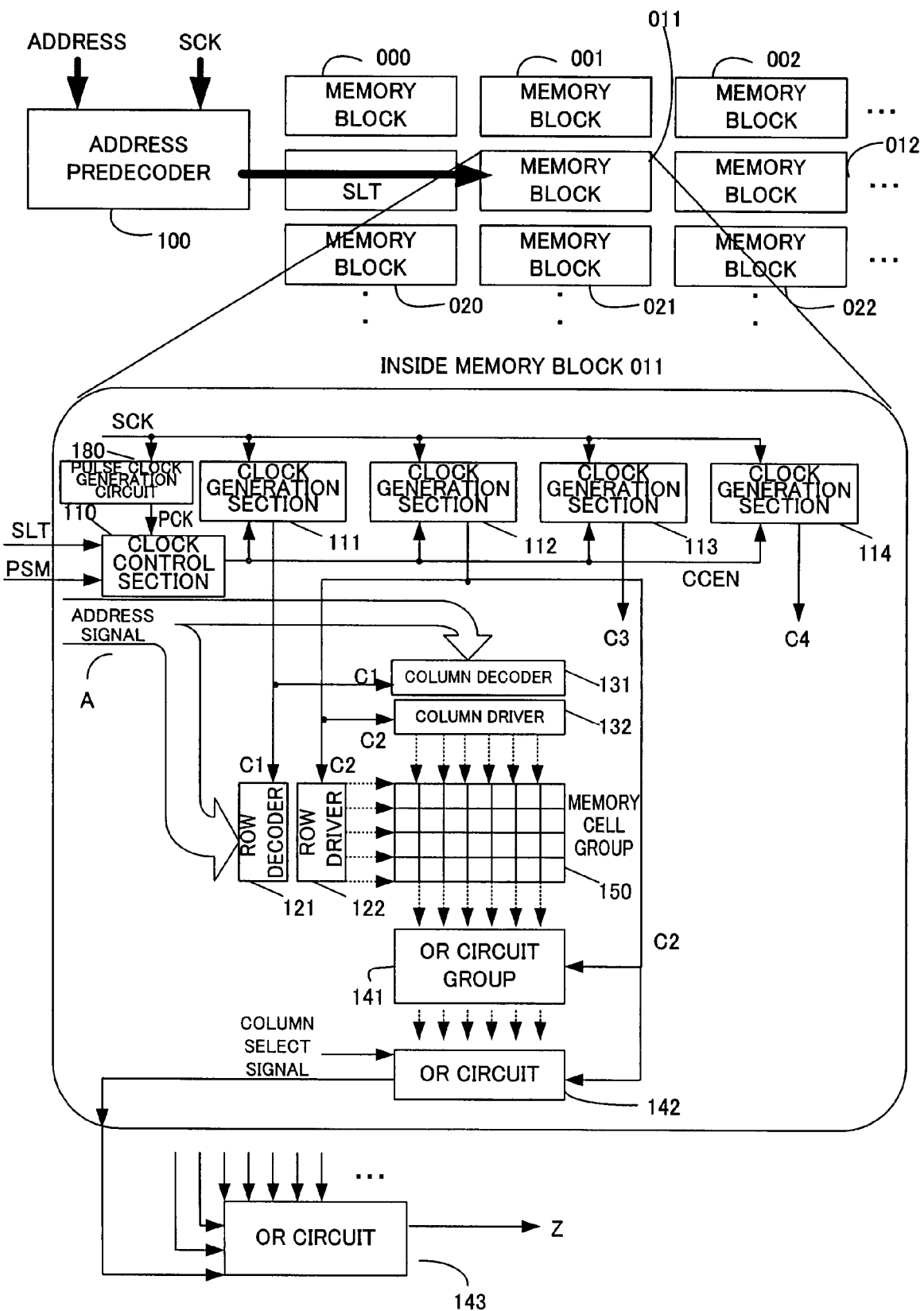
FIG. 10 is a diagram depicting a dynamic circuit system for saving energy of a RAM memory system.

FIG. 10 shows a dynamic circuit system for saving power of a RAM memory system. The RAM memory system is comprised of an address predecoder 100, a plurality of memory blocks 000-022 and an OR circuit 143. In the memory block 011, a pulse clock generation circuit 180, a clock control section 110, a clock generation sections 111-114, and a memory cell group 150, for example, are provided. The clock control section 110 has a same configuration as the clock control section in FIG. 9. Each of the clock generation sections 111-114 has a configuration the same as the clock generation section in FIG. 6, or has a configuration where a delay circuit is added to the pre-stage of the output terminal of the clock generation section in FIG. 6 so as to shift the timing of the control clocks C1-C4 to be generated respectively. In the memory block, a row decoder 121, row driver 122, column decoder 131, column driver 132, OR circuit group for data output 141, and OR circuit for column selection 142 are provided for reading and writing data from/to the memory cell group 150. The row decoder 121, row driver 122, column decoder 131, column driver 132, OR circuit group 141 and OR circuit 142 are all dynamic circuits.

Figure 11:
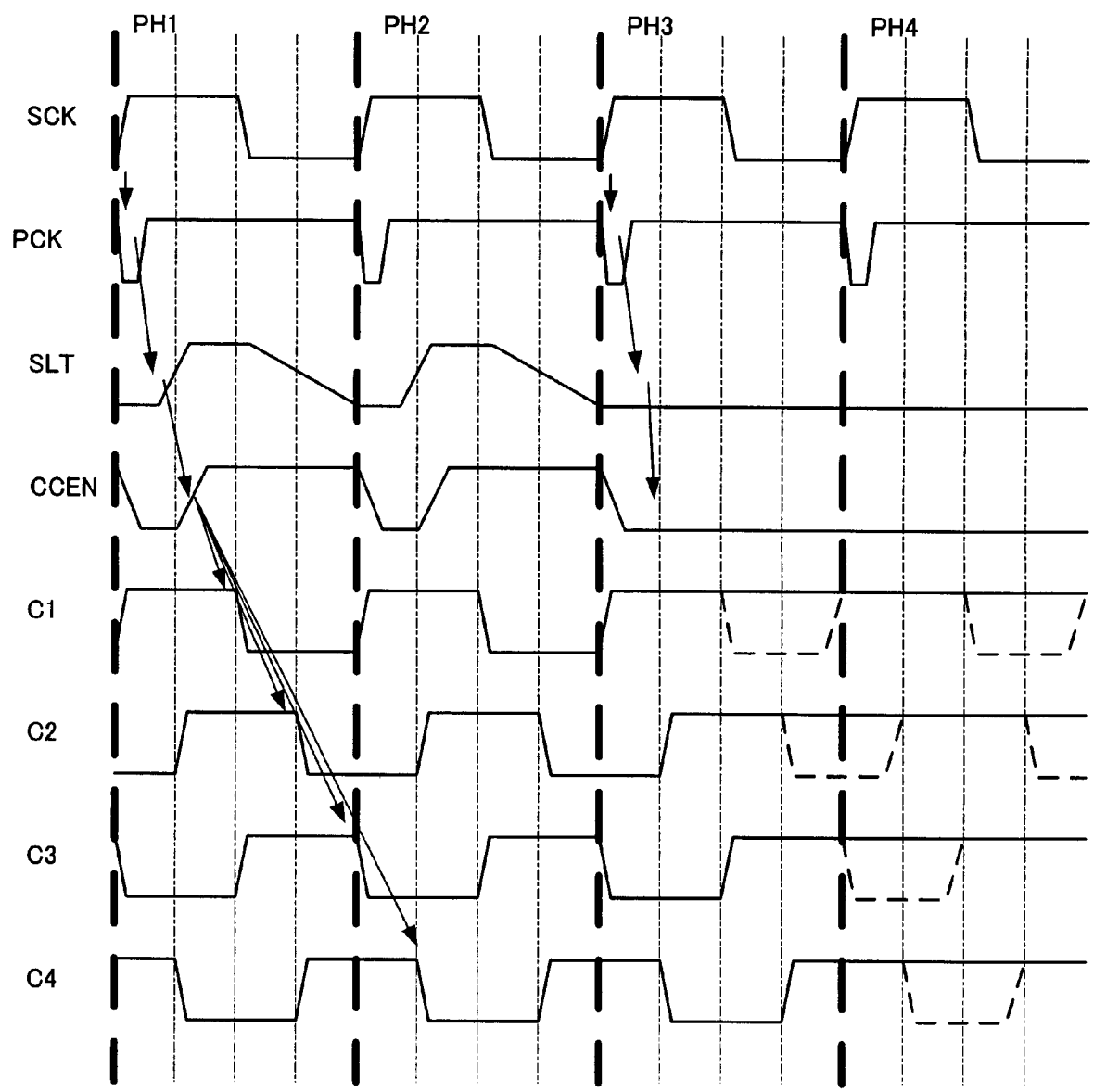
FIG. 11 is a timing chart of the operation of a clock control section, and clock generation sections 111-114 in the RAM section of the present embodiment.

FIG. 11 is a timing chart according to the present embodiment. The phase PH1 and phase PH2 show the timing chart when the memory block is selected, and the phase PH3 and phase PH4 show the timing chart when the memory block is not selected.

The operation when the block select signal SLT is supplied will now be described with the reference to phase PH1 and PH2 in FIG. 11. By the L level of the pulse clock PCK with a short pulse width, the control clock enable signal CCEN is reset to L level. Then by switching of the pulse clock PCK to H level and supplying of the block select signal SLT, the control clock enable signal CCEN becomes H level. And by the input of the L level of the pulse clock PCK of phase PH2, the control clock CCEN is reset to L level again.

The control clock enable signal CCEN, along with the inverted system clock SCK, are input to the NAND gate 620 of the clock generation sections 111-114 (see FIG. 6). Therefore if the control clock enable signal CCEN is in H level, the system clock SCK, delayed by the inverter 610 and the NAND gate 620, is output as the control clock C1. The control clocks C2-C4 are control clock C1 further delayed.

Operation when the block select signal SLT is not supplied will now be described with reference to phase PH3 and phase PH4 in FIG. 11. The control clock enable signal CCEN is reset to L level by the L level of the pulse clock PCK with a short pulse width. Then the pulse clock PCK is switched to H level, but the block select signal SLT is not supplied. Therefore the control clock enable signal CCEN does not become H level, but is maintained in L level.

The control clock enable signal CCEN, along with the inverted system clock SCK, are input to the NAND gate 620 of the clock generation sections 111-114 (see FIG. 6). Therefore if the control clock enable signal CCEN is in L level, the control clock C1 is maintained in H level regardless the status of the system clock SCK. The control clocks C2-C4, which are control clock C1 further delayed, are also maintained in H level.

In this way, if the block select signal SLT is not supplied, the control clocks C1-C4 are maintained in H level, and enter stop status.

The dynamic circuit group in the selected memory block performs operation to execute a predetermined function when the control clocks C1-C4 are supplied. In this case, precharge and discharge are repeated and power is consumed. However the dynamic circuit group in the memory block which is not selected, to which the control clocks C1-C4 are not supplied, does not perform an operation to execute a predetermined function, and power is not consumed.

Figure 12:
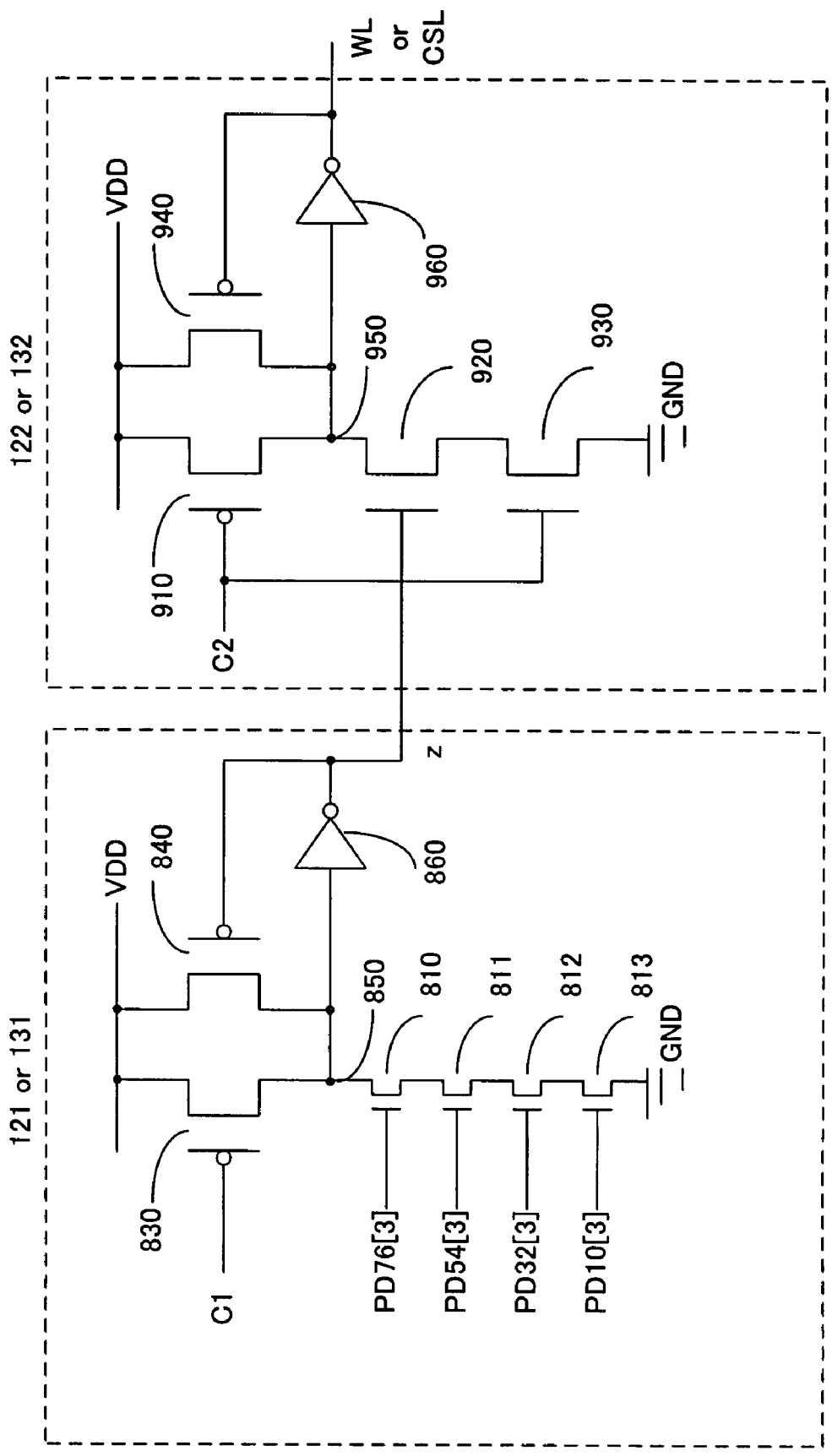
FIG. 12 is a circuit diagram depicting a row decoder and row driver.
Figure 13:
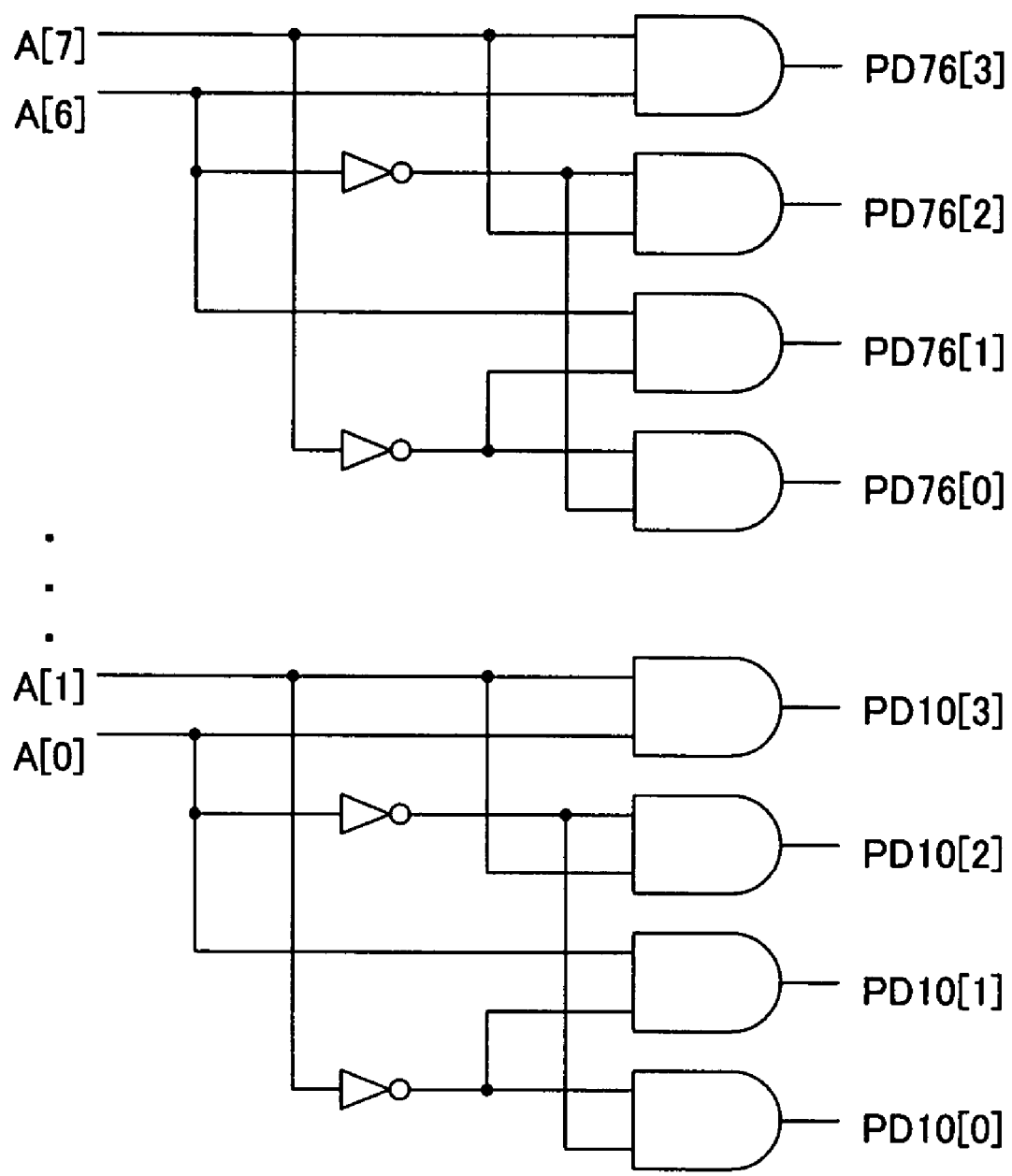
FIG. 13 is a diagram depicting a pre-stage circuit of the row decoder.

FIG. 12 is a circuit diagram depicting the row decoder 121 and the row driver 122. FIG. 13 is a diagram depicting a pre-stage circuit of the row decoder. In a selected memory block, the row decoder 121 operates synchronizing with the control clock C1 generated in the clock generation section 111, and selects a word line WL of a memory cell to be read. A predecoder comprised of an inverter and AND circuit, shown in FIG. 13, generates a predecode signal to a 2-bit address signal out of the 8-bit address signal A. In FIG. 13, precode signals PD 76[3]-PD 76[0] are generated from address signals A[7] and A[6], and in the same way, precode signals PD 54[3]-PD 54[0], PD 32 [3]-PD 32[0] and PD 10[3]-PD 10 [0] are generated from the address signals A[5] and A[4], A[3] and A[2], and A[1] and A[0] respectively. These precode signals are input to the n-type MOS transistors 810-813 of each row decoder. If the signals which were input are all in H level, the word line WL connected to the row decoder is selected. As FIG. 12 shows, the node 850 is precharged by the input of the L level of the control clock C1, and output z of the row decoder 121 is reset to L level. Then when all the n-type MOS transistors 810-813 of the row decoder 121 receive the H level signal, the node 850 is discharged. By this, the output z of the row decoder 121 becomes H level. The row driver 122, on the other hand, is reset by the input of the L level pulse of the control clock C2, which is delayed from the control clock C1, then the n-type MOS transistor 920 turns ON responding to the input of the H level of the output z of the row decoder 121, and the node 950 is discharged. By this, the word line WL is driven to H level.

At this time, in a memory block which is not selected, the control clocks C1 and C2 are not supplied to the row decoder 121 and the row driver 122. Therefore the row decoder 121 and the row driver 122 of the dynamic circuit are not precharged, and power consumption is suppressed.

The column decoder 131 and the column driver 132 also have the same configuration as FIG. 12. The column decoder 131 operates synchronizing with the control clock C1 generated in the clock generation section 111, and selects a column of a memory cell to be read. The column driver 132 operates synchronizing with the control clock C2 generated in the clock generation section 112, and supplies the column select signal CSL to the column selected by the column decoder 131.

At this time, in a memory block which is not selected, the control clocks C1 and C2 are not supplied to the column decoder 131 and the column driver 132. Therefore the column decoder 131 and the column driver 132 are not precharged, and power consumption is suppressed.

Figure 14:
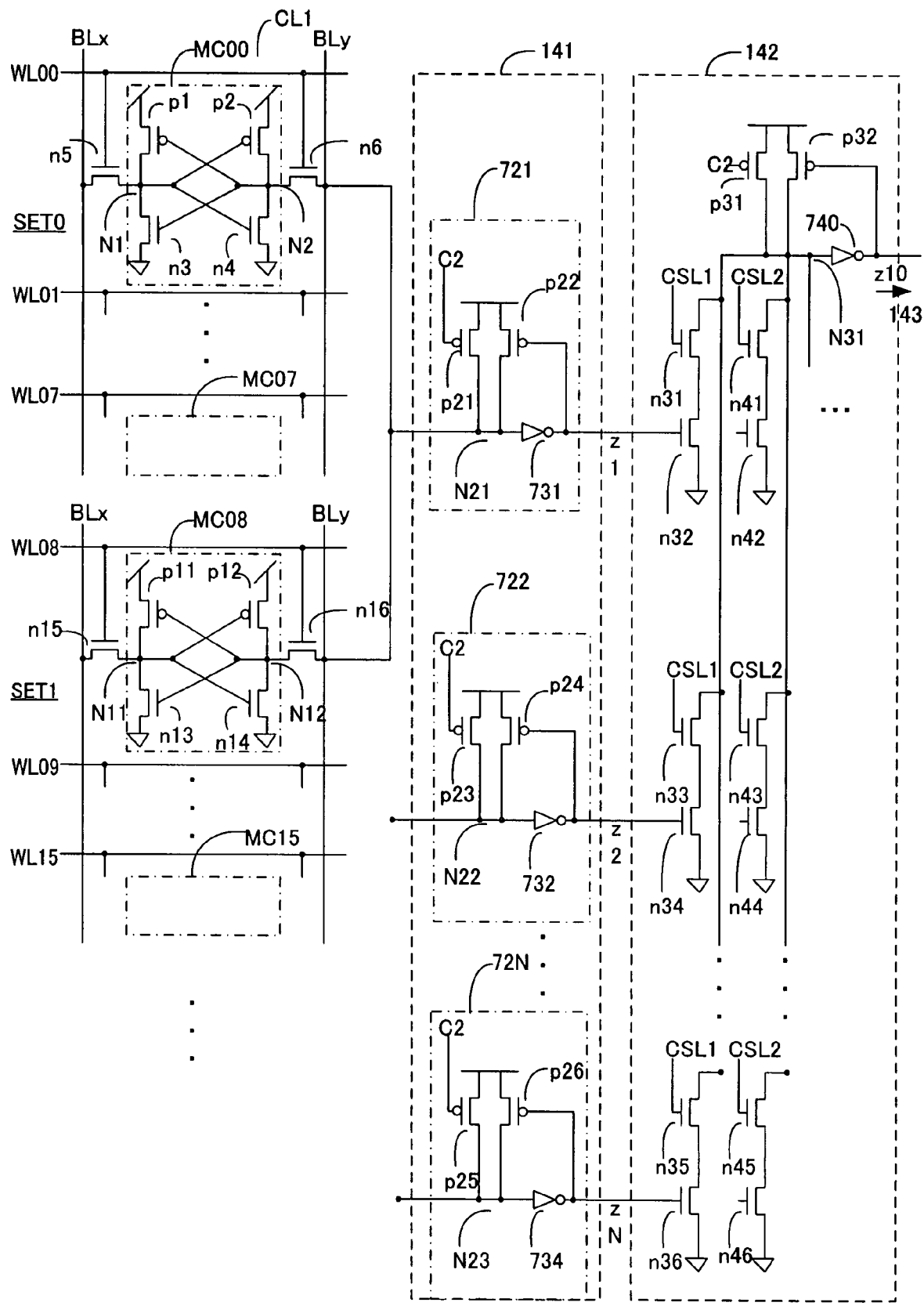
FIG. 14 is a diagram depicting operation of an OR circuit during read operation.

FIG. 14 is a diagram depicting a configuration of an output section of a memory system according to the fourth embodiment. FIG. 14 shows one column CL1 of a memory cell group 150 and the corresponding OR circuit group 141 and OR circuit 142.

Here a 1RW type SRAM, where read or write is performed once in 1 cycle, will be described as an example. However [the present invention] can be applied to a multi-port SRAM such as a 2RW where read or write is performed twice in 1 cycle, and a 2R2W where read and write are performed twice respectively in 1 cycle, a register file and a memory system such as a DRAM and FRAM. A column CL1 of the memory cell group has memory cells MC00-MC15 where an inverter is cross-connected, at the crossing positions of the bit line pair BLx and BLy and the word lines WL00-WL15. The memory cell MC00 has p-type transistors p1 and p2 and n-type transistors n3 and n4 which constitute an inverter, and n-type gate transistors n5 and n6 which are opened by the word line WL00. The other memory cells have a same configuration. The bit line pair BLx and BLy are separated into memory cell sets SET0 and SET1 which are comprised of 8 memory cells MC00-MC07 and MC08-MC15 respectively. 2 bit lines BLy, one [of the bit line pair], are connected to the OR circuit 721 of the OR circuit group 141.

This OR circuit 721 has a reset transistor p21 controlled by the control clock C2, an inverter 731 and a transistor for latching p22, just like the above mentioned dynamic circuit, and constitute a dynamic OR circuit, along with the transistors n4, n6, n14 and n16 of the memory cell connected to [this OR circuit 721]. In other words, the OR circuit 721, along with the cell transistors of the memory cell sets SET0 and SET1, constitute an OR circuit, and the OR circuits 722 and 72N along with the cell transistors of the 2 memory cell sets, which are not illustrated, constitute an OR circuit respectively.

In the OR circuit 721, a node N21 is reset to H level responding to the L level pulse of the control clock C2. And responding to the status of the corresponding memory cell of the selected word line, the node N21 is set to L level or is maintained in H level. Here the read operation will be described as an example. If it is assumed that the word line WL00 is selected and the transistor n6 is turned ON, the transistor n4 of the memory cell MC00 is connected to the OR circuit 721 and becomes an OR circuit of which input is the node N1 in the memory cell MC00. At this time, all other word lines are in L level, so the gate transistor is not turned ON, and the discharge operation of the node N21 in the OR circuit 721 is not affected. If it is assumed that the node N1 is in L level, the transistor n4 is in OFF status, so the node N21 in the OR circuit 721 maintains H level. If the node N1 is in H level, on the other hand, the transistor n4 is in ON status, and the node N21 in the OR circuit 721 becomes L level and the OR circuit 721 outputs the output z1 in H level. For the OR circuits 722 and 72N connected to the bit line of the same column CL1, the outputs z2-zN thereof all remain in L level since the corresponding word lines remain in L level.

In this way, the OR circuit group 141, along with the transistor of the memory cell, constitute an OR circuit, and outputs the status of the selected memory cell to the outputs z1-zN at high-speed.

The outputs z1-zN from the OR circuit group 141 in the previous stage and the column select signal CSL are then supplied to the OR circuit 142 in addition to the control clock C2. The column select signal CSL1 is supplied to the transistors n31, n33 and n35, and the outputs z1-zN of the OR circuit group 141 in the previous stage are supplied to the transistors n32, n34 and n36. In the same way, the OR circuit 142 has transistors n41-n46 to which the same signal is supplied from another column. And the transistor group to which the column select signal CSL in H level is supplied operates as an OR circuit. This OR circuit 142 as well is reset by the L level pulse of the control clock C2, and the node 31 is controlled according to the output of the OR circuit group in the previous stage.

If it is assumed that the column CL1 is selected, the column select signal CSL1 becomes H level, the transistors n31, n33 and n35 are turned ON, the column select signal CSL2 becomes L level, and the transistors n41, n43 and n45 are turned OFF. As a result, the OR circuit 142 constitutes an OR circuit of which input is the outputs z1-zN from the OR circuit group 141. If one of the outputs z1-zN is in H level, the node N31 becomes L level and the output z10 thereof becomes H level. As mentioned above, one of the outputs z1-zN becomes H level or L level according to the status of the memory cell corresponding to the selected word line, and all the outputs z1-zN corresponding to the unselected word line become L level, so the OR circuit 142 outputs the status of the memory cell according to the selected word line and the selected column as the output z10 thereof.

In this way, the OR circuit 142 has a function to determine the logical OR of the output of the OR circuit group 141 in the previous stage, in addition to the column select function. In the subsequent stage of the OR circuit 142, the OR circuit 143, similar to OR circuit 142, is provided and the final output data z is output from there. The OR circuit 143 in the final stage determines the logical OR of the output data of a plurality of memory blocks, and outputs the data of the selected memory cell in the selected memory block.

The OR circuit group 141 and the OR circuit 142 are dynamic circuits, so high-speed operation is possible. The OR circuit group 141 and the OR circuit 142 in the selected memory block operate synchronizing with the control clock C2, repeat precharge and discharge, and consume power. However in the memory block which is not selected, the control clock C2 is not supplied to the OR circuit group 141 and the OR circuit 142. Therefore the OR circuit group 141 and the OR circuit 142 do not perform precharge, and power consumption is suppressed.

In this way, the RAM memory system according to the present embodiment can suppress power consumption by selecting a memory block to be read or to be written, and operates only dynamic circuits in [the selected memory block] so as to limit the dynamic circuits which perform precharge and discharge. Therefore a semiconductor device which uses dynamic circuits for high-speed operation and which can still decrease power consumption can be provided.

FIG. 15 is a table showing the improvement of the cycle time, access time and power consumption of the memory system of the fourth embodiment. This table shows a memory system A constructed by static circuits and the above mentioned memory systems B and C constructed by dynamic circuits, and the corresponding cycle time, access time and power consumption. The memory system B is a case when the power saving mode signal PSM is in L level, and the power saving function of the dynamic circuits is deactivated, and the memory system C is a case when the power saving mode signal PSM is in H level, and the power saving function is activated.

If the cycle time, access time and power consumption of the memory system A constructed by static circuits are "1", then both the cycle time and the access time are improved to "0.74" and "0.80" in memory systems B and C respectively. In memory system B, where all dynamic circuits are activated, power consumption increased, that is to "1.37", but in memory system C, where the dynamic circuits are only partially activated, power consumption dramatically improves to "0.64". In other words, in memory system C according to the present embodiment, both operation speed and power consumption are improved.

INDUSTRIAL APPLICABILITY

According to the present invention, the power consumption of a semiconductor device using dynamic circuits can be suppressed. As a result, dynamic circuits can be used for semiconductor devices which have been implemented with static circuits, and speed can be increased. For semiconductor devices where dynamic circuits have already been used, an increase of battery capacity, to be installed, can be avoided.

The invention claimed is:

1. A semiconductor device, comprising a plurality of functional blocks and a select signal generation circuit for supplying a select signal to a functional block to be operated out of said plurality of functional blocks, characterized in that each of said plurality of functional blocks comprises:
   a clock generation unit to which said select signal and a system clock are supplied, and which generates a control clock based on said system clock when said select signal is being supplied, and stops generation of said control clock when said select signal is not being supplied; and
   a dynamic circuit including a p-type transistor of which gate is supplied with said control clock and an n-type transistor of which gate is supplied with an input signal, which are provided in series between a power supply and a ground, wherein a node between said p-type transistor and said n-type transistor is precharged responding to the supply of said control clock and discharged responding to said input signal.

2. The semiconductor device according to claim 1, wherein said clock generation unit comprises: a clock control section to which said select signal and a system clock are supplied, and which starts generation of a control clock enable signal responding to the supply of said select signal, and ends generation of said control clock enable signal responding to the end of 1 cycle of said system clock; and a clock generation section to which said control clock enable signal and said system clock are supplied, and which generates said control clock based on said system clock while said control clock enable signal is being supplied, and stops generation of said control clock while said control clock enable signal is not being supplied.

3. The semiconductor device according to claim 2, wherein said clock control section in said clock generation unit starts generation of said control clock enable signal responding to the supply of said select signal, and ends generation of said control clock enable signal responding to the end of 1 cycle of said system clock when a power saving mode signal is being supplied, and generates said control clock enable signal regardless the input of said select signal when said power saving mode signal is not being supplied.

4. A semiconductor memory, comprising a plurality of memory blocks and an address predecoder for supplying a block select signal to a memory block for performing reading or writing out of said plurality of memory blocks, characterized in that each of said plurality of memory blocks comprises:
   a clock generation unit to which said block select signal and a system clock are supplied and which generates a control clock based on said system clock when said block select signal is being supplied, and stops generation of said control clock when said block select signal is not being supplied;
   a memory cell group for holding data;
   a row decoder for selecting a word line of data of a memory cell;
   a row driver for driving said word line selected by said row decoder;

a column decoder for selecting a column of said memory cell;

a column driver for supplying a column select signal CSL to said column selected by said column decoder; and an output circuit group to which said bit line of said memory cell group is input and from which a read data is output, said row decoder, said row driver, said column decoder, said column driver and said output circuit group are formed by a dynamic circuit including a p-type transistor of which gate is supplied with said control clock and an n-type transistor of which gate is supplied with an input signal, which are provided in series between a power supply and a ground, wherein a node between said p-type transistor and said n-type transistor is precharged responding to the supply of said control clock and discharged responding to said input signal.

5. The semiconductor memory according to claim 4, wherein said clock generation unit comprises:

a clock control section to which said block select signal and a system clock are supplied and which starts generation of a control clock enable signal responding to the supply of said block select signal, and ends generation of said control clock enable signal responding to the end of 1 cycle of said system clock; and a clock generation section to which said control clock enable signal and said system clock are supplied, and which generates said control clock based on said system clock while said control clock enable signal is being supplied, and stops generation of said control clock while said control clock enable signal is not being supplied.

6. The semiconductor memory according to claim 5, wherein said clock control section in said clock generation unit starts generation of said control clock enable signal responding to the supply of said block select signal, and ends generation of said control clock enable signal responding to the end of 1 cycle of said system clock when a power saving mode signal is being supplied, and generates said control clock enable signal regardless the input of said block select signal when said power saving mode signal is not being supplied.

* * * * *